(12) United States Patent
Laporte et al.

(10) Patent No.: US 12,266,613 B2
(45) Date of Patent: Apr. 1, 2025

(54) ELECTRONIC DEVICE COMPRISING A PACKAGE PROVIDED WITH AN INTERCONNECTION STRUCTURE

(71) Applicants: STMicroelectronics (Grenoble 2) SAS, Grenoble (FR); STMicroelectronics (Alps) SAS, Grenoble (FR)

(72) Inventors: Claire Laporte, Grenoble (FR); Laurent Schwartz, La Buisse (FR); Godfrey Dimayuga, Grenoble (FR)

(73) Assignees: STMicroelectronics (Grenoble 2) SAS, Grenoble (FR); STMicroelectronics (Alps) SAS, Grenoble (FR)

( * ) Notice: Subject to any disclaimer, the term of this patent is extended or adjusted under 35 U.S.C. 154(b) by 397 days.

(21) Appl. No.: 17/847,330

(22) Filed: Jun. 23, 2022

(65) Prior Publication Data
US 2022/0415822 A1    Dec. 29, 2022

(30) Foreign Application Priority Data
Jun. 29, 2021 (FR) ..................................... 2106999

(51) Int. Cl.
| | |
|---|---|
| H01L 23/49 | (2006.01) |
| H01L 23/498 | (2006.01) |
| H01L 23/538 | (2006.01) |
| H01L 23/552 | (2006.01) |

(52) U.S. Cl.
CPC ...... *H01L 23/552* (2013.01); *H01L 23/49822* (2013.01)

(58) Field of Classification Search
CPC ............. H01L 23/552; H01L 23/49822; H01L 23/49827; H01L 2924/15174; H01L 23/49816; H01L 2924/15311; H01L 23/5386; H01L 23/49838
USPC .................................. 257/668, 659; 438/123
See application file for complete search history.

(56) References Cited

U.S. PATENT DOCUMENTS

| | | | |
|---|---|---|---|
| 6,323,116 B1 | 11/2001 | Lamson | |
| 2004/0084768 A1 | 5/2004 | Devnani et al. | |
| 2009/0294899 A1* | 12/2009 | Pagaila | ................... H01L 24/97 |
| | | | 257/E29.325 |
| 2012/0091567 A1* | 4/2012 | Pagaila | ................. H01L 21/565 |
| | | | 257/659 |

(Continued)

OTHER PUBLICATIONS

INPI Search Report and Written Opinion for priority application, FR 2106999, report dated Mar. 14, 2022, 8 pgs.

*Primary Examiner* — Didarul A Mazumder
(74) *Attorney, Agent, or Firm* — Crowe & Dunlevy LLC

(57) ABSTRACT

A support substrate has a mounting face and a connection face opposite to the mounting face. An electronic chip is mounted to the mounting face and a matrix of connectors is mounted to the connection face. The support substrate includes an interconnection structure formed by a pair of conductive interconnection tracks that electrically connect the electronic chip to the matrix of connectors and circulate differential signals. The two interconnection tracks of the pair of conductive interconnection tracks extend facing each other at different depths of the support substrate. An isolation structure in the support substrate laterally isolates the pair of conductive interconnection tracks. Isolation plates above and below the pair of conductive interconnection tracks provide further isolation.

10 Claims, 3 Drawing Sheets

(56) References Cited

U.S. PATENT DOCUMENTS

| | | | |
|---|---|---|---|
| 2012/0286407 A1* | 11/2012 | Choi | H01L 21/4853 |
| | | | 257/676 |
| 2013/0087921 A1* | 4/2013 | Wahl | H01L 23/498 |
| | | | 257/773 |
| 2017/0330825 A1 | 11/2017 | Chou et al. | |
| 2020/0251411 A1 | 8/2020 | Ganesan et al. | |
| 2020/0312759 A1 | 10/2020 | Collins et al. | |
| 2020/0328143 A1* | 10/2020 | Marinov | H05K 1/189 |
| 2021/0104461 A1 | 4/2021 | Wu et al. | |
| 2022/0148954 A1* | 5/2022 | Huang | H01L 23/5384 |

* cited by examiner

ELECTRONIC DEVICE COMPRISING A PACKAGE PROVIDED WITH AN INTERCONNECTION STRUCTURE

PRIORITY CLAIM

This application claims the priority benefit of French Application for Patent No. 2106999, filed on Jun. 29, 2021, the content of which is hereby incorporated by reference in its entirety to the maximum extent allowable by law.

TECHNICAL FIELD

Embodiments of the present description relate to the field of electronic devices including a package integrating an electronic chip and, more particularly, to the electrical interconnections in this package.

BACKGROUND

The package of such an electronic device generally includes a support substrate forming a base of the package. This support substrate has a first face, referred to as the upper face, to which an electronic chip is attached, and a second face, referred to as the lower face, opposite to the first face, carrying a matrix of connectors intended to be assembled on a printed circuit board.

The support substrate comprises an interconnection structure for connecting the electronic chip to the connectors of the matrix of connectors.

The interconnection structure generally comprises conductive tracks configured to circulate electrical signals between the electronic chip and the matrix of connectors.

The interconnection structure may, in particular, comprise at least one pair of conductive tracks, referred to as a differential pair, configured to circulate differential signals.

In particular, the differential pair is used for reducing, or even eliminating, electronic noise related to the transmission of signals. For this purpose, a differential pair makes it possible to circulate two complementary signals with opposite signs and values.

The two complementary signals being in phase opposition, it suffices to make the difference between the two signals of the two tracks to cancel out the noise superimposed during the transmission.

Conventionally, a differential pair is formed by two coplanar conductive tracks parallel to each other. In order to ensure integrity of the signals the two tracks of the pair are spaced apart by a minimum width to comply with impedance matching conditions.

The interconnection structure may comprise a plurality of coplanar differential pairs parallel to each other.

In this way, the interconnection structure lies in the plane of the differential pairs over a distance that depends on the width of the interconnection tracks of the various differential pairs, on the distance between the interconnection tracks of the same differential pair, and on the distance between the various differential pairs. Thus, the greater the number of differential pairs, the more space is occupied by the interconnection structure in the support substrate.

In addition, it is important to reduce, or even to eliminate, diaphony (better known by the usual term "crosstalk") between the signals flowing in the various differential pairs. This is because such crosstalk may cause interference and may give rise to signal losses.

In order to reduce, or even to eliminate, the crosstalk between the differential pairs, it is possible to add conductive tracks, referred to as isolation tracks, connected to a reference point, in particular to a ground, to isolate the differential pairs.

These isolation tracks are located between the differential pairs and are coplanar with the latter. In this way, these isolation tracks further increase the dimensions of the interconnection structure.

However, the dimensions of the support substrate limit the space available for the interconnection structure. Thus, the greater the number of differential pairs that the interconnection structure has, the more space is required by the support substrate laterally (i.e., in the plane of the interconnection tracks of the differential pairs).

In order to reduce the lateral space requirement of the interconnection structure, two conventional solutions can be envisaged.

A first solution consists in reducing the number of differential pairs. This solution has the drawback of also reducing the number of differential signals that can be transmitted between the electronic chip and the matrix of connectors.

A second solution consists in reducing the width of the isolation tracks between the differential pairs and/or the distance between the interconnection tracks of the differential pairs and the isolation tracks. Nevertheless, such a solution has the drawback of increasing the crosstalk between the differential pairs.

There is therefore a need for proposing a solution for reducing the lateral space requirement of a differential pair, in particular when a plurality of pairs are grouped together, while guaranteeing the integrity of the differential signals of each pair.

SUMMARY

According to one aspect an electronic device comprising an electronic chip and a package is proposed.

The package includes a matrix of connectors and a support substrate having a mounting face and a connection face opposite to the mounting face.

The electronic chip is mounted on the mounting face and the matrix of connectors is mounted on the connection face.

The support substrate comprises an interconnection structure including a pair, referred to as a differential pair, of conductive interconnection tracks connecting the electronic chip to the matrix of connectors, the interconnection tracks of the pair being configured to circulate differential signals.

The pair of interconnection tracks comprises two interconnection tracks extending facing each other at different depths of the substrate while being separated from each other by a dielectric layer of the substrate.

Thus, such a differential pair extends in width over a distance equal to the width of its interconnection tracks. Such a differential pair therefore occupies in width a limited space compared with a differential pair with a coplanar interconnection track, which it extends in width over a distance equal to the sum of the widths of its interconnection tracks and of the distance between these two tracks.

Such a differential pair therefore makes it possible to limit the lateral dimensions of the interconnection structure in the support substrate compared with an interconnection structure having coplanar pairs of interconnection tracks.

In this way, it is possible to increase the number of differential pairs of the interconnection structure without reducing the performance thereof in terms of transmitting differential signals.

In particular, the dielectric layer of the substrate between the two interconnection tracks has sufficient thickness to guarantee the integrity of the differential signals in the differential pair.

According to one embodiment, the substrate further comprises a structure for isolating electromagnetic fields configured for being electrically connected to an electrical reference point.

The isolation structure includes at least two pairs of conductive tracks, referred to as isolation tracks, configured for being electrically connected to the reference point.

Each pair of isolation tracks comprising two isolation tracks extending opposite each other at different depths of the substrate while being separated from each other by said dielectric layer.

The pair of interconnection tracks is situated between two pairs of isolation tracks and parallel to the latter.

Thus, the isolation structure makes it possible to limit crosstalk between the signals of each differential pair so as to guarantee the integrity of the differential signals.

In particular, the at least two pairs of isolation tracks are located on each side of the at least one pair of interconnection tracks, to make it possible to limit the crosstalk due to signals coming from sources located on the sides of the differential pair.

In addition, the two isolation tracks of each pair of isolation tracks are located at two different depths of the substrate to make it possible to limit the crosstalk due to signals coming from sources located at these two depths.

Moreover, the constant lateral spacing makes it possible to limit the crosstalk continuously along the interconnection tracks of each differential pair.

Preferably, the interconnection structure includes a plurality of pairs of interconnection tracks, parallel to each other. Each pair of interconnection tracks is then located between two pairs of isolation tracks and parallel to the latter.

Thus, the interconnection structure makes it possible to transport in parallel as many different differential signals as there are differential pairs integrated in the structure.

In addition, the isolation structure is optimized to comprise a minimum number of pairs of isolation tracks making it possible both to limit the space required and to protect the differential pairs against crosstalk.

According to one embodiment, the isolation structure comprises conductive vias electrically connecting the two conductive tracks of each pair of isolation tracks through the dielectric layer.

The vias are disposed regularly along the isolation tracks.

Thus, the vias of the isolation structure make it possible to form vertical isolation walls for limiting the crosstalk due to signals coming from sources located on flanks of each differential pair.

According to one embodiment, the isolation structure comprises a first plate configured for being electrically connected to the reference point.

The first plate extends parallel to the dielectric layer, the first plate being located on the same side as the mounting face of the substrate opposite the interconnection structure and outside the dielectric layer.

Thus, the first plate of the isolation structure makes it possible to form a first horizontal isolation wall, located on the same side as the mounting face of the substrate, for limiting the crosstalk due to signals coming from sources located above the first plate on the same side as the mounting face.

According to one embodiment, the isolation structure comprises a second plate configured for being electrically connected to the reference point.

The second plate extends parallel to the dielectric layer, the second plate being located on the same side as the connection face of the substrate facing the interconnection structure and outside the dielectric layer.

Thus, the second plate of the isolation structure makes it possible to form a second horizontal isolation wall, located on the same side as the connection face of the substrate, for limiting the crosstalk due to signals coming from sources located below the second plate on the same side as the connection face.

According to one embodiment, said dielectric layer of the substrate has a thickness of between 25 and 840 micrometers.

BRIEF DESCRIPTION OF THE DRAWINGS

Other advantages and features will emerge from the examination of the detailed description of embodiments that are in no way limitative, and the accompanying drawings, on which.

DETAILED DESCRIPTION

Figure 1:
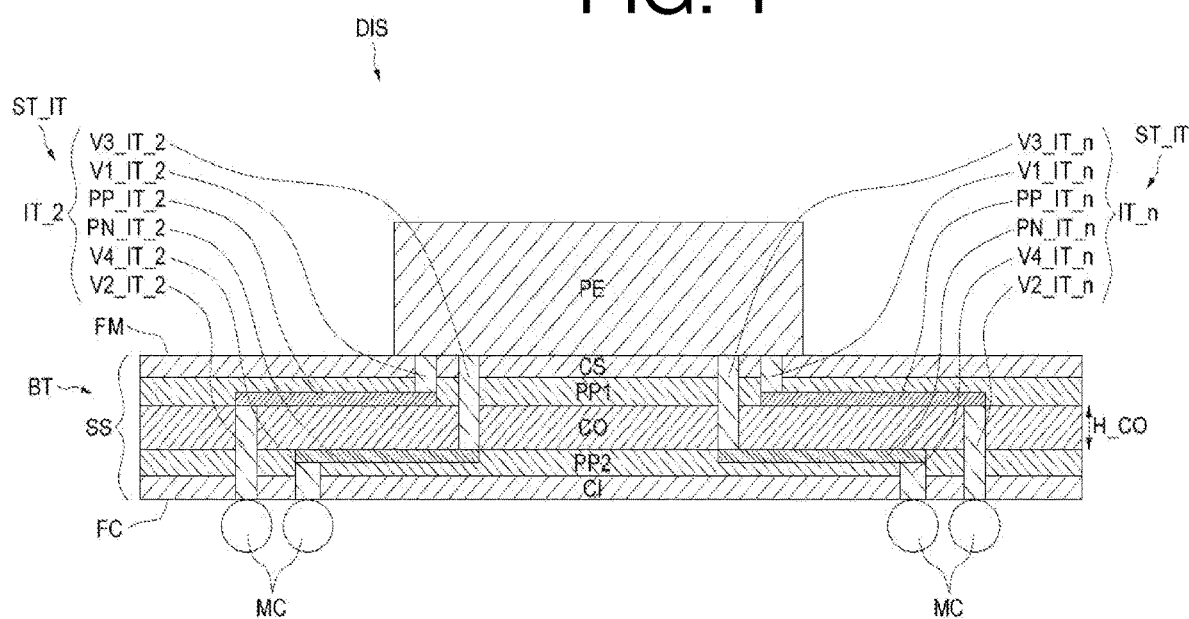
FIG. 1 schematically illustrates a view in cross section of an electronic device.

FIG. 1 schematically illustrates a view in cross section of an electronic device DIS comprising an electronic integrated circuit chip PE integrated in a package BT.

The package BT includes a support substrate SS having a mounting face FM opposite to a connection face FC and a matrix of connectors MC.

The matrix of connectors MC is configured for being assembled with a printed circuit board. The matrix of connectors MC is, for example, a matrix of solder beads.

The electronic chip PE is mounted on the mounting face FM of the substrate SS and the matrix of connectors MC is mounted on the connection face FC of the support substrate SS.

The package BT may also comprise an encapsulation cover (not shown) attached to the mounting face FM of the substrate so as to protect the electronic chip PE.

The support substrate SS comprises an interconnection structure ST_IT configured for electrically connecting the electronic chip PC to the matrix of connectors MC.

The interconnection structure ST_IT is integrated in a superimposition of layers forming the support substrate SS.

In particular, the substrate SS comprises a dielectric layer CO, a first layer of preimpregnated material PP1, a second layer of preimpregnated material PP2, a lower layer CI and an upper layer CS.

The preimpregnated material, known by the usual term "PREimPREGnated", more commonly called "PREPREG".

The dielectric layer CO is, for example, a central layer, formed from insulating resin, and providing the rigidity of the substrate.

Alternatively, if the substrate does not specifically comprise a layer ensuring the rigidity of the substrate, then the dielectric layer CO may comprise, for example, a preimpregnated material or an insulating microfilm of the "ABF" type (the acronym designating the product "Ajinomoto Build-up Film" from the company Ajinomoto).

The dielectric layer CO has a thickness H_CO.

The lower layer CI and the upper layer CS are insulating layers made from a material such as a preimpregnated material, an insulating microfilm of the "ABF type, or, where applicable, an insulating resin similar to the resin of a central layer of the substrate.

The interconnection structure ST_IT comprises differential pairs IT_2, IT_n. Each differential pair is configured for circulating differential signals between the electronic chip PE and the matrix of connectors MC.

Each differential pair comprises two conductive tracks PP_IT_2, PN_IT_2, PP_IT_n, PN_IT_n, for example metallic, which will be referred to hereinafter as "interconnection tracks".

The interconnection tracks are interposed between isolating layers forming the substrate.

Each differential pair comprises firstly a first interconnection track PP_IT_2, PP_IT_n, configured to circulate a first signal (for example of positive polarity) and comprises secondly a second interconnection track PN_IT_2, PN_IT_n configured to circulate a second signal (for example of negative polarity).

The first signal and the second signal are differential signals.

For each differential pair, the first interconnection track is connected firstly to the electronic chip PE by a first via V1_IT_2, V1_IT_n and secondly to the matrix of connectors MC by a second via V2_IT_2, V2_IT_n.

Likewise, the second interconnection track is connected firstly to the electronic chip by a third via V3_IT_2, V3_IT_n, and secondly to the matrix of connectors by a fourth via V4_IT_2, V4_IT_n.

Within each differential pair, the two interconnection tracks and their respective vias establish two electrical connection paths between the electronic chip PE and the matrix of connectors MC.

These two paths of electrical connections between the electronic chip PE and the matrix of connectors MC are configured to have via heights and interconnection-track lengths that compensate for each other so that the two connection paths have overall equal impedances and lengths.

Thus, a differential pair as described above makes it possible to optimize impedance matching.

The view in cross section of the present illustration shows solely two differential pairs IT_2, IT_n. Nevertheless, naturally, the substrate may comprise any number "n" of differential pairs, as the index "_n" in the reference "IT_n" implies.

Figure 2:
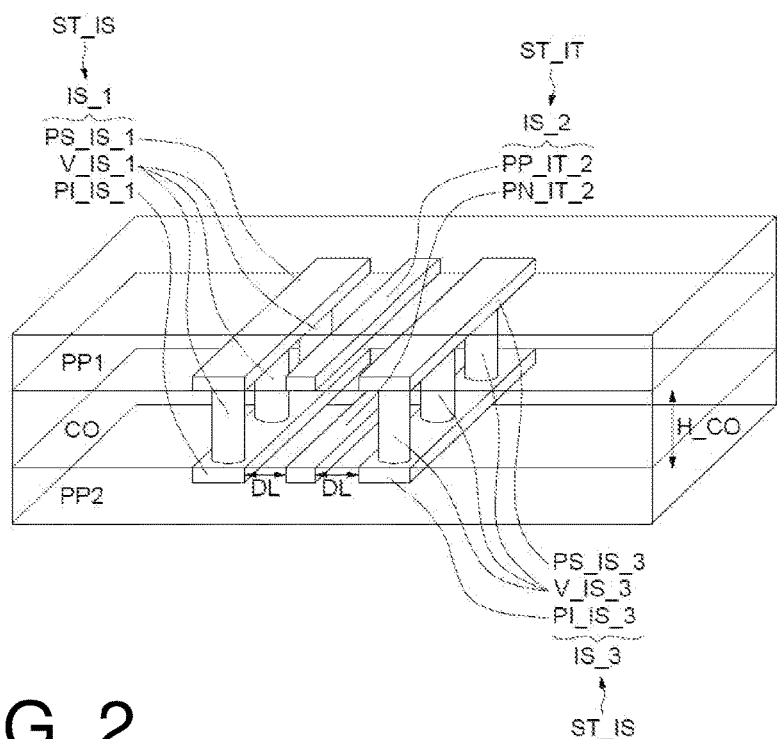
FIG. 2 schematically illustrates a perspective view of a differential pair.

FIG. 2 schematically illustrates a perspective view of a differential pair IT_2 integrated in the interconnection structure ST_IT in the substrate SS described in relation to FIG. 1.

In the differential pair IT_2, the first interconnection track PP_IT_2, is disposed on an upper face of the dielectric layer CO and the second interconnection track PN_IT_2 is disposed on a lower face of the dielectric layer CO.

Each interconnection track PP_IT_2, PN_IT_2 is supported by one of the faces delimiting the dielectric layer CO.

The two interconnection tracks PP_IT_2, PN_IT_2 of the differential pair IT_2 are stacked vertically in the thickness of the substrate while being separated by the dielectric layer CO.

The two interconnection tracks PP_IT_2, PN_IT_2 of the differential pair IT_2 extend parallel to each other while being spaced apart by the thickness H_CO.

The thickness H_CO is selected to optimize the impedance matching between the two interconnection tracks.

Advantageously, the thickness H_CO of the dielectric layer CO is between 25 and 840 micrometers, these dimensions are conventional for a substrate dielectric layer.

A thickness of between 25 and 840 micrometers allows optimum impedance matching in the differential pair IT_2 for differential signal frequencies of between a hundred megahertz and a few hundreds of gigahertz.

The first interconnection track PP_IT_2 is disposed between the first layer of preimpregnated material PP1 and the upper face of the dielectric layer CO.

The second interconnection track PN_IT_2 is disposed between the second layer of preimpregnated material PP2 and the lower face of the dielectric layer CO.

Moreover, the interconnection structure ST_IT is associated with a structure ST_IS for isolating electromagnetic fields, also referred to as electromagnetic shielding.

The isolation structure ST_IS is configured for electromagnetically isolating the differential pair IT_2 from electromagnetic interference coming for example from other adjacent differential pairs, and more generally coming from surrounding electromagnetic sources.

For this purpose, the isolation structure ST_IS is configured for being electrically connected to an electrical reference point, in particular to a ground.

The reference point is typically at a neutral voltage with respect to the voltages of the differential signals.

The isolation structure ST_IS includes at least two pairs of conductive tracks PS_IS_1, PI_IS_1, PS_IS_3, PI_IS_3, which hereinafter will be referred to as isolation tracks, configured for being electrically connected to the reference point.

The isolation structure ST_IS is formed so that the two pairs of isolation tracks are situated on either side of the pair IT_2 of interconnection tracks.

In particular, the two pairs of isolation tracks PS_IS_1, PI_IS_1, PS_IS_3, PI_IS_3 are spaced apart by a constant lateral distance DL with respect to a pair of interconnection tracks PP_IT_2, PN_IT_2. The isolation tracks and interconnection tracks are parallel to each other.

Like the pairs of interconnection tracks, each pair of isolation tracks comprises two isolation tracks, including an upper isolation track PS_IS_1, PS_IS_3, located on the upper face of the dielectric layer CO, and a lower isolation track PI_IS_1, PI_IS_3, situated on the lower face of the dielectric layer CO.

In each pair, the upper isolation track PS_IS_1, PS_IS_3, and the lower isolation track PI_IS_1, PI_IS_3 extend at least partly facing each other at different depths of the substrate. The first interconnection track PP_IT_2 and the upper isolation tracks PS_IS_1, PS_IS_3, are coplanar, they are supported by the upper face of the dielectric layer CO.

Likewise, the second interconnection track PN_IT_2 and the lower isolation tracks PI_IS_1, PI_IS_3 are also coplanar, they are supported by the lower face of the dielectric layer CO.

In each pair, the isolation structure ST_IS furthermore comprises conductive vias V_IS_1, V_IS_3, electrically connecting the upper isolating tracks PS_IS_1, PS_IS_3 and the lower isolating tracks PI_IS_1, PI_IS_3 through the dielectric layer.

The conductive vias V_IS_1, V_IS_3 are disposed regularly along the isolation tracks, in an arrangement configured for concentrating the electromagnetic field lines flowing between the two isolation tracks of each pair.

Figure 3:
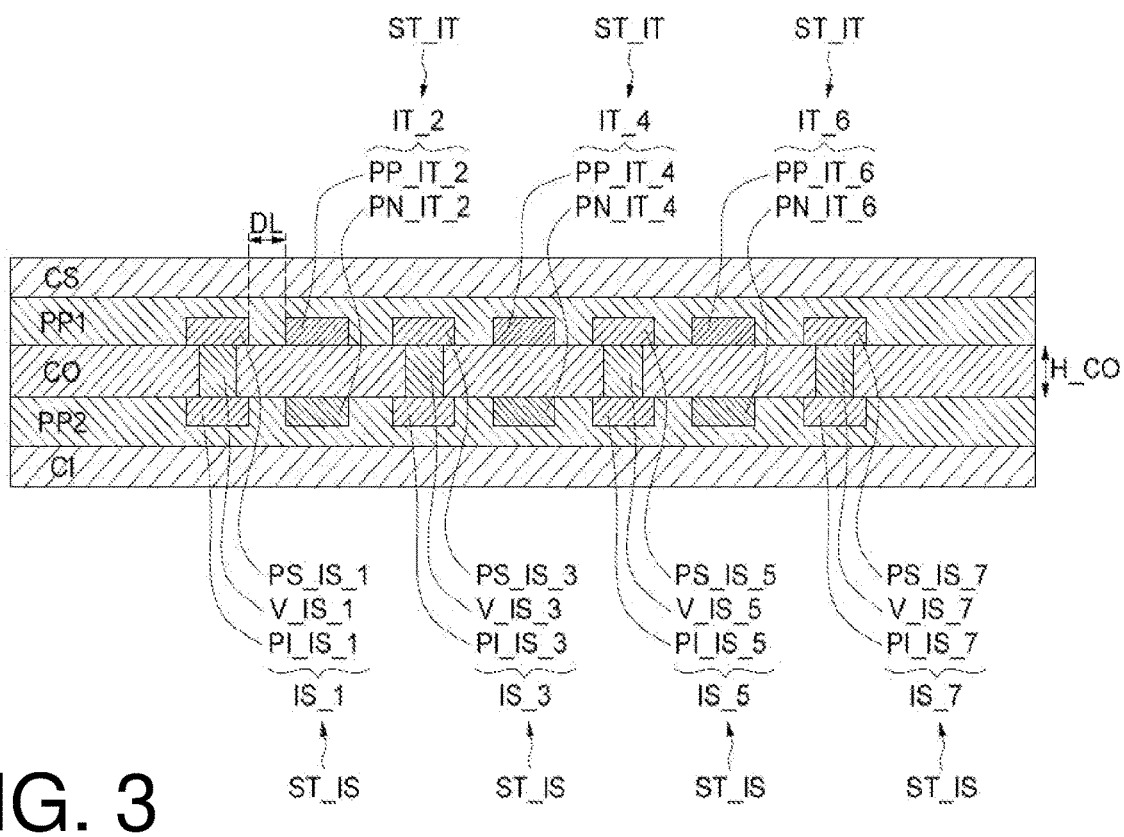
FIG. 3 schematically illustrates a view in cross section of the substrate shown in FIG. 1.

FIG. 3 schematically illustrates a view in cross section of the substrate SS, described in relation to FIG. 1, on a plane perpendicular to the cutting plane of FIG. 1.

The interconnection structure ST_IT includes three pairs IT_2, IT_4, IT_6 of interconnection tracks and the isolation structure ST_IS includes four pairs IS_1, IS_3, IS_5, IS_7 of isolation tracks.

The pairs of interconnection tracks are arranged in alternation with the pairs of isolation tracks so that each pair of interconnection tracks is located between two pairs of isolation tracks.

The isolation structure ST_IS is configured for electromagnetically isolating the different pairs from each other.

In addition, the isolation structure ST_IS is configured for isolating the interconnection structure ST_IS from surrounding electromagnetic sources.

Advantageously, each pair of isolation tracks comprises vias V_IS_1, V_IS_3, V_IS_5, V_IS_7, connecting the upper isolation track and the lower isolation track, to form vertical isolation walls between each differential pair.

Each differential pair of the interconnection structure ST_IT is arranged vertically to have an optimized lateral space requirement, of the order of magnitude of the width of a single interconnection track.

Thus, the lateral space requirement of such an alternation of pairs of interconnection tracks and of pairs of isolation tracks in the substrate SS is advantageously reduced compared with an interconnection structure having pairs of coplanar interconnection tracks.

Figure 4:
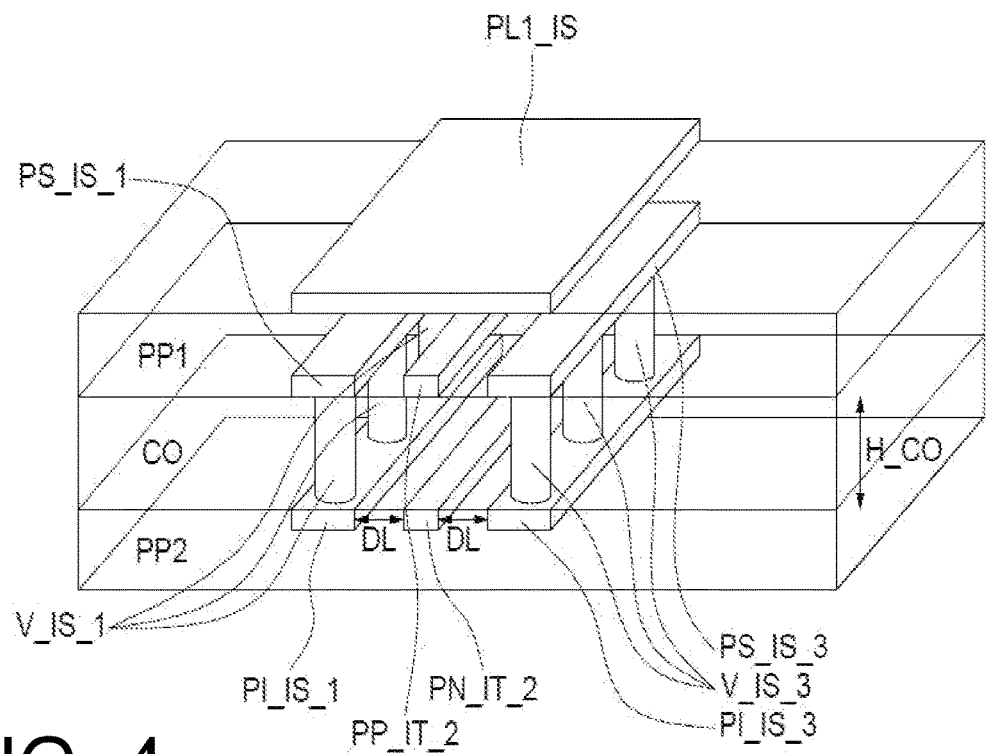
FIG. 4 schematically illustrates a perspective view of a differential pair and plate in a first location.

FIG. 4 schematically illustrates a perspective view repeating the elements described in relation to FIG. 2 and furthermore comprising a first plate PL1_IS added to the isolation structure ST_IS.

The first plate PL1_IS above the upper face of the dielectric layer CO and on the same side as the mounting face of the substrate.

The first plate PL1_IS is configured to be electrically connected to the reference point. The first plate PL1_IS extends parallel to the dielectric layer CO.

The first plate PL1_IS extends opposite the interconnection structure, in particular the first plate PL1_IS extends laterally from a first pair of isolating tracks as far as a last pair of isolating tracks.

Figure 5:
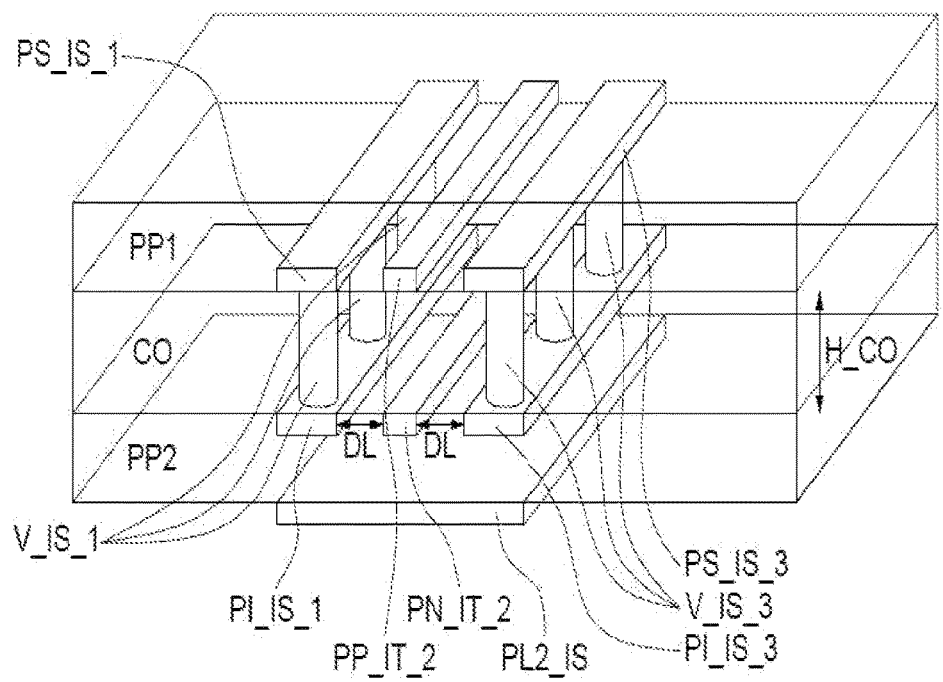
FIG. 5 schematically illustrates a perspective view of a differential pair and plate in a second location.

FIG. 5 schematically illustrates a perspective view repeating the elements described in relation to FIG. 2 and furthermore comprising a second plate PL2_IS added to the isolation structure.

The second plate PL2_IS is situated below the lower face of the dielectric layer CO and on the same side as the connection face of the substrate.

The second plate PL2_IS is configured to be electrically connected to the reference point.

The second plate PL2_IS extends parallel to the dielectric layer CO.

The second plate PL2_IS extends opposite the interconnection structure, in particular the second plate PL2_IS extends laterally from a first pair of isolating tracks as far as a last pair of isolating tracks.

Figure 6:
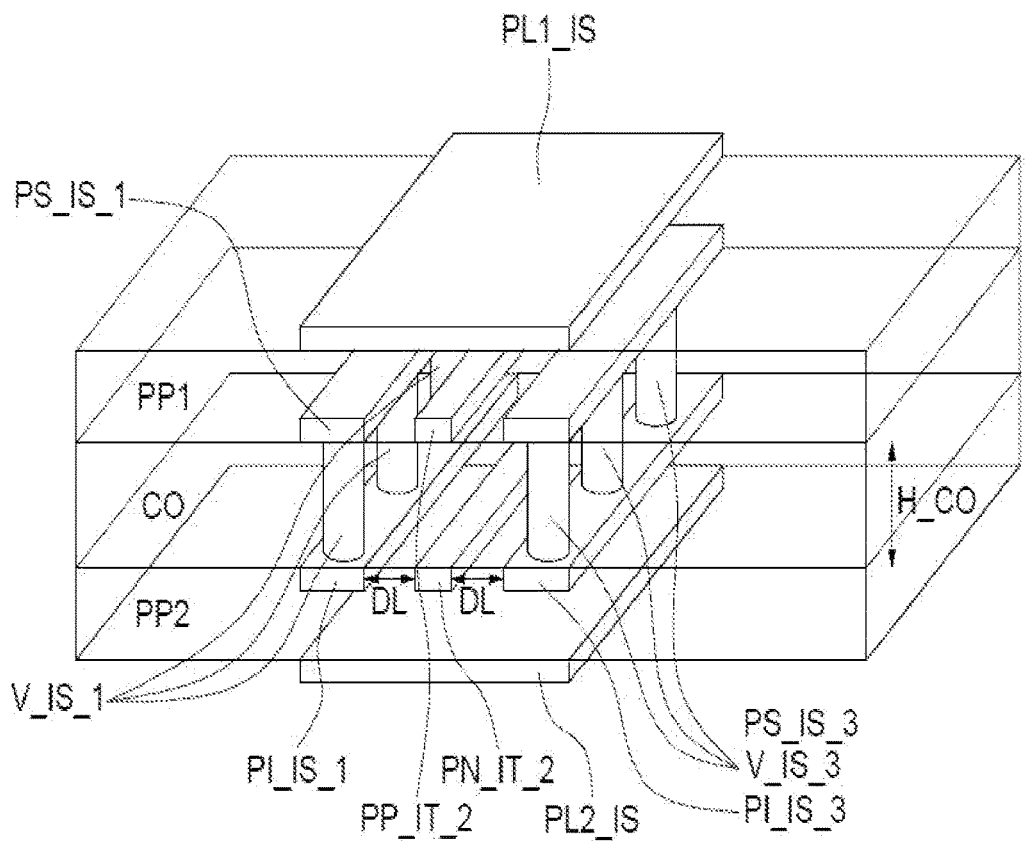
FIG. 6 schematically illustrates a perspective view of a differential pair and plates.

FIG. 6 schematically illustrates a perspective view of a third embodiment of the isolation structure comprising both the first plate PL1 described in relation to FIG. 4 and the second plate PL2 described in relation to FIG. 5.

The first plate PL1_IS is parallel to the second plate PL2_IS. The spatial extensions of the first plate PL1_IS and of the second plate PL2_IS are substantially symmetrical with respect to the dielectric layer CO.

The invention claimed is:

1. An electronic device, comprising:
a support substrate having a mounting face and a connection face opposite to the mounting face;
an electronic integrated circuit chip mounted to the mounting face; and
a matrix of connectors mounted to the connection face;
wherein the support substrate comprises:
an interconnection structure including a pair of conductive interconnection tracks that connect the electronic integrated circuit chip to the matrix of connectors, wherein the pair of conductive interconnection tracks are configured to circulate differential signals, and wherein the pair of conductive interconnection tracks comprises two interconnection tracks extending parallel to the mounting and connection faces and facing each other at different depths of the support substrate while being separated from each other by a dielectric layer of the support substrate; and
a structure for isolating electromagnetic fields configured to be electrically connected to an electrical reference point, the structure comprising at least two pairs of conductive isolation tracks, configured to be electrically connected to the electrical reference point, each pair of the at least two pairs of conductive isolation tracks comprising two isolation tracks extending parallel to the mounting and connection faces and facing each other at different depths of the substrate while being separated from each other by said dielectric layer; and
wherein the pair of conductive interconnection tracks is located between said at least two pairs of conductive isolation tracks and extending parallel to the at least two pairs of conductive isolation tracks.

2. The device according to claim 1, wherein the two isolation tracks of each pair of the at least two pairs of conductive isolation tracks are coplanar with corresponding ones of the two interconnection tracks of the pair of conductive interconnection tracks.

3. The device according to claim 1, wherein the structure for isolating electromagnetic fields further comprises a plurality of conductive vias that electrically connect the two isolation tracks of each pair of the at least two pairs of conductive isolation tracks through the dielectric layer.

4. The device according to claim 3, wherein the plurality of vias are disposed regularly along each pair of the at least two pairs of conductive isolation tracks and extend through the dielectric layer of the support substrate.

5. The device according to claim 1, wherein the structure for isolating electromagnetic fields further comprises a plate configured to be electrically connected to the reference point, said plate extending parallel to the dielectric layer and supported by the support substrate.

6. The device according to claim 5, wherein the plate is positioned between the interconnection structure and the mounting face of the support substrate.

7. The device according to claim 5, wherein the plate is positioned between the interconnection structure and the connection face of the support substrate.

8. The device according to claim 1, wherein the structure for isolating electromagnetic fields further comprises:
- a first plate configured to be electrically connected to the reference point, said first plate extending parallel to the dielectric layer and supported by the support substrate at a position between the interconnection structure and the mounting face of the support substrate; and
- a second plate configured to be electrically connected to the reference point, said second plate extending parallel to the dielectric layer and supported by the support substrate at a position between the interconnection structure and the connection face of the substrate.

9. The device according to claim 1, wherein said dielectric layer of the support substrate has a thickness of between 40 and 200 micrometers.

10. The device according to claim 1, wherein each pair of the at least two pairs of conductive isolation tracks is spaced apart from an adjacent pair of conductive interconnection tracks by a constant lateral distance.

* * * * *